United States Patent [19]
Radjy et al.

[11] Patent Number: 5,579,261
[45] Date of Patent: Nov. 26, 1996

[54] REDUCED COLUMN LEAKAGE DURING PROGRAMMING FOR A FLASH MEMORY ARRAY

[75] Inventors: Nader Radjy, Palo Alto; Lee E. Cleveland, Santa Clara; Jian Chen, San Jose; Shane C. Hollmer, Santa Clara, all of Calif.

[73] Assignee: Advanced Micro Devices, Inc., Sunnyvale, Calif.

[21] Appl. No.: 426,716

[22] Filed: Apr. 21, 1995

[51] Int. Cl.$^6$ .................................................. G11C 16/02
[52] U.S. Cl. .............................. 365/185.33; 365/185.18; 365/185.30
[58] Field of Search ......................... 365/185.29, 185.30, 365/185.33, 185.23, 185.24, 185.18

[56] References Cited

U.S. PATENT DOCUMENTS

| | | | |
|---|---|---|---|
| 5,293,212 | 3/1994 | Yamamoto | 365/185.33 |
| 5,396,459 | 3/1995 | Arakawa | 365/185.29 |
| 5,408,429 | 4/1995 | Sawada | 365/185.12 |
| 5,416,738 | 5/1995 | Shrivastava | 365/185.30 |

OTHER PUBLICATIONS

J. Chen, N. Radjy, S. Cagnina and J. Lien, "Study of Over Erase Correction Convergence Point Vth*," Advanced Micro Devices Technology Conference, 1994, pp. 68–69.

S. Yamada, T. Suzuki, E. Obi, M. Oshikiri, K. Naruke and M. Wada, "A Self–Convergence Erasing Scheme For A Simpled Stacked Gate Flash EEPROM," IEEE *Tech. Dig.* IEDM 1991, pp. 307–310.

*Primary Examiner*—David C. Nelms
*Assistant Examiner*—Son Mai
*Attorney, Agent, or Firm*—Fliesler, Dubb, Meyer & Lovejoy

[57] ABSTRACT

A method for programing a cell in an array of flash memory cells connected to a bit line using hot-electron injection. In the method, a negative word line voltage is applied to unselected cells connected to the bit line to create a negative gate to source voltage in the unselected cells. The negative gate to source voltage in the unselected cells is provided to prevent overerased cells, or cells which have a negative threshold, from turning on to reduce bit line leakage current.

5 Claims, 2 Drawing Sheets

REDUCED COLUMN LEAKAGE DURING PROGRAMMING FOR A FLASH MEMORY ARRAY

BACKGROUND OF THE INVENTION

1. Field of the Invention

The present invention relates to the programing of cells in a memory array. More particularly, the present invention relates to a method for programing memory cells in a flash memory array while avoiding bit line leakage current which may be created by overerased cells in the array.

2. Description of the Related Art

FIG. 1 shows a cross section of a typical flash EEPROM array cell 2. The cell 2 is formed on a substrate 4 having a source 6 and drain 8 provided adjacent to its surface. Separated from the substrate 4 by an oxide layer is a floating gate 10 which is further separated from a control gate 12 by an additional oxide layer.

In one method for programing termed hot electron injection, a current is established between the source 6 and drain 8 while a large positive voltage is typically established between the control gate 12 and drain 8. For instance, during programing a typical gate voltage $V_g$ may be set to 13 V while a drain voltage $V_D$ is set to 6 V and the source voltage $V_s$ is grounded. The large positive gate-to-drain voltage enables electrons flowing from the source to drain to overcome an energy barrier existing between the substrate 2 and the oxide underlying the floating gate 10 enabling the electrons to be driven onto the floating gate 10. The electrons stored on the floating gate 10 increase the cell threshold voltage (the gate-to-source voltage required for a cell to turn on or conduct).

To represent a data bit, the floating gate 10 is programmed to store a charge as described above. In a programmed state, the threshold voltage of cells is typically set at greater than 6.5 volts, while the threshold voltage of cells in the erased state is typically limited below 3.0 volts. To read a cell, a control gate voltage between the 3.0 and 6.5 volt range, typically 5 V, is applied. With 5 V applied to the gate, in a programmed state with a threshold above 6.5 V, a current will not conduct between the drain and source, but in an erased state with a threshold below 3.0 V a current will conduct.

To erase the cell 2, a positive source to drain voltage is applied along with a large positive source to gate voltage. For instance, during erase a typical gate voltage $V_G$ may be set to −10 V while the source voltage $V_s$ is set to +5 V and the drain is floated. The large positive source-to-gate voltage enables electrons to tunnel from the floating gate 10 reducing the threshold voltage of the cell.

FIG. 2 illustrates how memory cells of FIG. 1 are configured in an array. FIG. 2 includes a 3×3 array of memory cells 200, similar to those in FIG. 1, although a larger number of cells may be utilized. Drains of a column of memory cells in the memory cells 200 are connected to one of bit lines BL0–BL2. Gates of a row of memory cells in memory cells 200 are connected to one of word lines WL0–WL2. Sources of all memory cells in the array 200 are typically connected to ground.

Power is supplied to the individual word lines and bit lines by a power supply 202 to control programming, erase and read operations. Power is supplied to word lines WL0–WL2 through a wordline decoder 204. The wordline decoder provides a signal from the power supply 202 to the word lines WL0–WL2 as controlled by a wordline address signal received by the wordline decoder.

In a flash memory array, all cells are typically erased simultaneously. Erasing of the memory cells is typically done by repeated applications of a short, approximately 10 msec, erase voltage, described above, applied to each of the cells over the word lines.

After each application of the erase voltage, a read or verify wordline voltage of typically 5.0 V is applied from the power supply 202 to a row of memory cells over a wordline. Additionally, the 5.0 V read or verify wordline voltage is supplied from the power supply 202 to reference cells 208. An example of circuitry for reference cells 208 is included in U.S. Pat. application Ser. No. 08/160,582 entitled "Programmed Reference." Voltage is further applied from power supply 202 to bit lines of memory cells 200 and bit lines of reference cells 208 to create current from bit lines BL0–BL2 of memory cells 200 which is then received in sense amplifiers 206 along with current from at least one output from reference cells 208. Typically during verify, the current output of a reference cell having a 3.0 V threshold is compared with current from each of bit lines BL0–BL2 in sense amplifiers 206. If bit line current generated from a particular cell in memory cells 200 is less than that of the reference cell with the 3.0 V threshold, indicating the particular cell threshold is above the 30 V limit, additional erase pulses are applied until the current of the particular cell is equal to or greater than current from the reference cell with the 3.0 V threshold.

One problem caused by overerased cells is bit line leakage current during programming. To program a selected cell, a positive voltage is applied to the bit line connected to the selected cell while a positive word line voltage is applied to a row of cells containing the selected cell with source lines grounded. The voltages applied to the selected cell create the positive drain to source voltage and the large positive gate to drain voltage, as described previously, to enable hot-electron injection in the selected cell. During programming wordlines of unselected cells are grounded. With an overerased cell on the bit line of the selected cell, zero volts on the gate of the overerased cell will be above its threshold causing it to conduct a bit line leakage current. A bit line leakage current during programming may overload the power supply current available.

Bit line leakage current is a significant concern when a charge pump is required in the power supply 202 to pump the bit line voltage above $V_{cc}$ during programming. A charge pump may be required for low power devices, such as 3 V devices currently utilized with battery powered notebook computers, to pump the voltage above 3 V during programming. Requiring the charge pump size to be further increased during programming to overcome any bit line leakage current is undesirable.

To prevent current leakage during programming, manufacturers may utilize a convergence method to place a minimum threshold limit on all cells. Several different convergence methods are employed by manufacturers.

In one convergence method, a voltage, such as 6 V, is applied to the source of erased memory cells while the gates and drains of the erased cells are grounded to create a drain disturb voltage. The effect of the drain disturb voltage causes the threshold voltages erased below 0 V to converge to a steady-state threshold voltage of approximately 0 V. See, for example, "A Self-Convergence Erasing Scheme for a Simple Stacked Gate Flash EEPROM," by S. Yamada et al. (Yamada), IEEE *Tech. Dig.* IEDM 1991, pp. 307–310.

In another convergence method, a voltage, such as 6 V is applied to the source of erased memory cells while grounding the drains, but applying a gate voltage above 0 V. The effects of the increased gate voltage enables voltages which would converge to approximately 0 V in Yamada to converge to a steady-state threshold voltage above 0 V. See, for example, U.S. Pat. application Ser. No. 08/160,057 entitled "An Adjustable Threshold Convergence Circuit", by J. Chen, et al. (Chen), filed Dec. 1, 1993.

A problem with the convergence methods of Yamada and Chen is that significant power is required for convergence. Significant power use results from the number of overerased cells which have a threshold voltage less than zero volts. When the drain disturb voltage is applied utilizing a gate to source voltage of zero volts, the overerased cells will conduct. With cells conducting, additional current is necessary to maintain the drain disturb voltage. By increasing the gate voltage above zero volts as disclosed in Chen, even more cells will conduct, thus further increasing the current required for convergence.

To reduce leakage current during convergence, another method for converging the threshold voltage distribution of memory cells after erase is described in U.S. Pat. application Ser. No. 08/269,540 entitled "Multistepped Threshold Convergence for a Flash Memory Array", by N. Radjy et al. (Radjy), filed Jul. 1, 1994, and incorporated herein by reference. In Radjy, a drain disturb voltage is applied to one or more bit lines of a memory array, similar to Yamada and Chen. However, instead of applying a single gate to source voltage of 0 V as in Yamada or a more positive value as in Chen, Radjy starts the overerase correction with a negative gate to source voltage and then increases the gate to source voltage until a desired minimum threshold value is reached. By applying a gate voltage with an initial negative value, overerased cells which have a higher threshold than the gate voltage will not conduct, reducing leakage current during convergence in comparison to both Yamada and Chen.

Although Yamada, Chen and Radjy enable convergence of the threshold values of erased cells, a possibility still may exist that cells have a negative threshold. Overerased cells may still remain particularly when the convergence method of Yamada is utilized because by converging thresholds to approximately 0 V, a significant number of cells with a slightly negative threshold can remain.

SUMMARY OF THE INVENTION

The present invention enables programming of memory cells using hot-electron injection with cells overerased, but with a reduced bit line leakage current from previous programing methods.

The present invention operates to reduced leakage current when programming in the presence of overerased cells even if no convergence method has been applied.

The present invention may also be applied even if a convergence method is applied in case overerased cells still remain to reduce leakage current.

The present invention is a method for programming a selected memory cell in an array of cells which includes overerased cells, using hot-electron injection. As in previous methods of programming, in the present invention a positive bit line voltage is applied to a column of cells containing the selected cell and a positive word line voltage is applied to a row of cells containing the selected cell with source lines grounded to enable hot-electron injection in the selected cell.

Unlike in previous programming using hot-electron injection, in the present invention a negative wordline voltage is applied to cells connected to the bit line of the selected cell. With a negative wordline voltage applied to unselected cells, a negative gate to source voltage occurs in the unselected cells. The negative gate to source voltage in the unselected cells is provided to prevent overerased cells, or cells with a negative threshold, from turning on to reduce bit line leakage current.

In one embodiment of the present invention measurements are made to assure the gate to source voltage applied to unselected cells is sufficient to substantially prevent any bit line leakage current during programming. The value of the gate to source voltage to substantially prevent bit line leakage is determined by applying an initial gate to source voltage to all cells connected to the bit line prior to programming with a drain voltage applied to the bit line to provide a bit line current. The gate to source voltage is then reduced from the initial value to a particular value where substantially no bit line current flows. A gate to source voltage having the particular value is then applied to unselected cells during programming of the selected cell to substantially prevent bit line leakage current.

BRIEF DESCRIPTION OF THE DRAWINGS

Further details of the present invention are explained with the help of the attached drawings in which.

DETAILED DESCRIPTION

Figure 1:
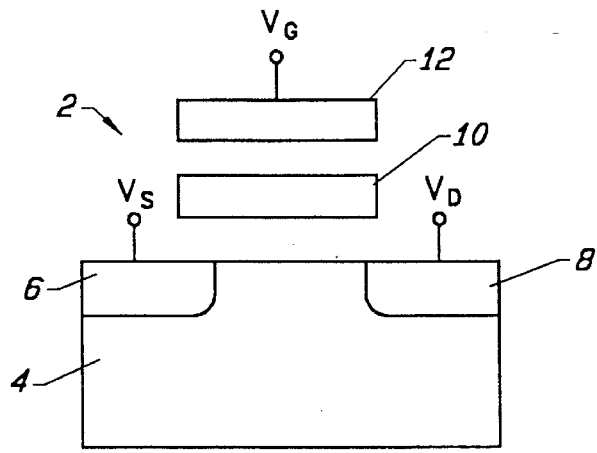
FIG. 1 shows a cross section of a typical flash EEPROM array cell.
Figure 2:
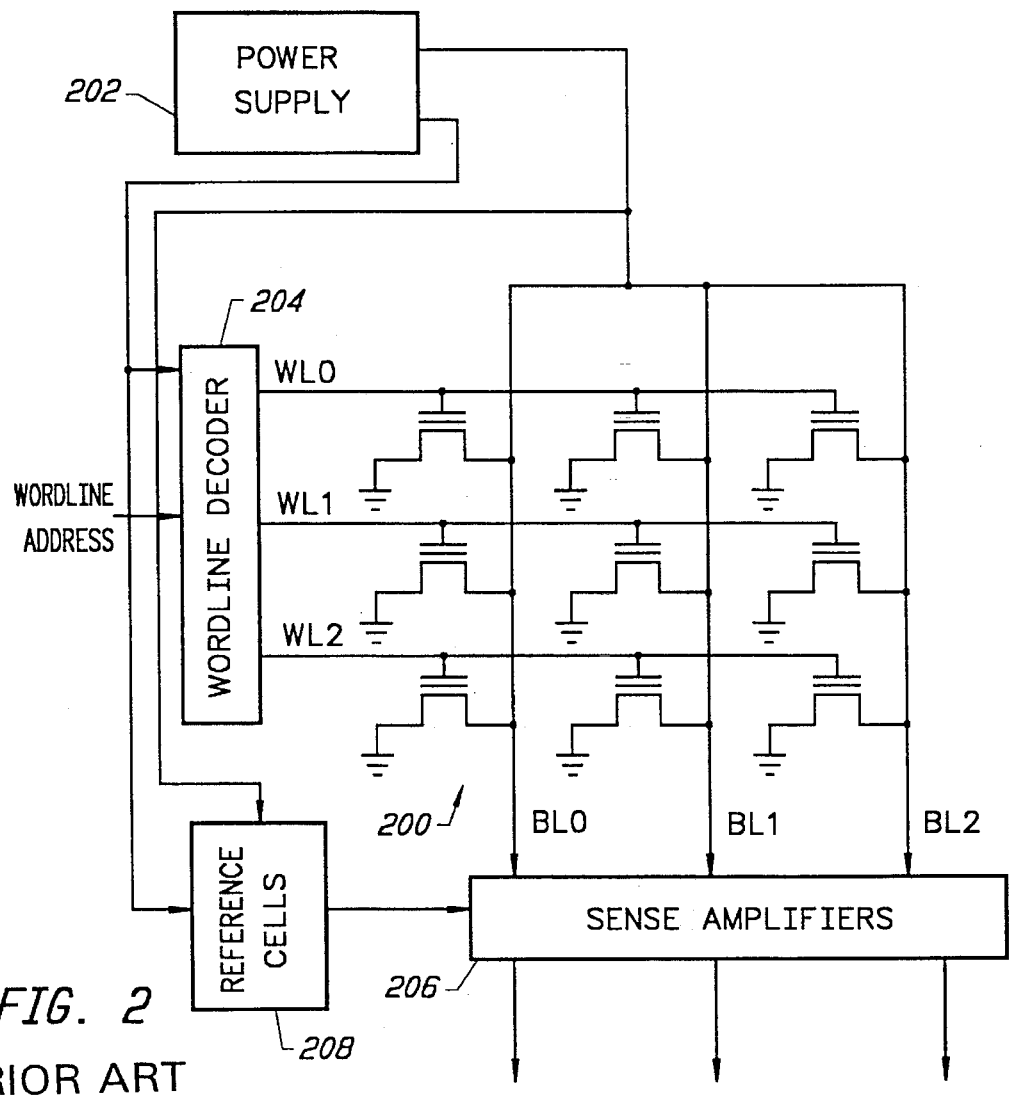
FIG. 2 illustrates how memory cells of FIG. 1 are configured in an array.

The present invention is a method of programming using hot-electron injection with reduced bit line leakage from previous methods. The method of the present invention is applicable to memory cells including the flash EEPROM cell shown in FIG. 1, as configured in an array as shown in FIG. 2.

The present invention uses conventional methods to program a selected cell utilizing hot-electron injection. Referring to FIG. 2, as described previously, to program a selected cell a positive voltage is applied from the power supply 202 to a bit line in bit lines BL0–BL2 which is connected to the selected cell. Further, a positive word line voltage is applied from power supply 202 through wordline decoder 204 as controlled by the wordline address to the wordline in wordlines WL0–WL2 connected to the selected cell. As described previously, a typical bit line voltage applied to the bit line connected to the selected cell is 6 V, while a typical word line voltage applied to the selected cell is 13 V. The source of the memory cells, including the selected cell remains tied to a reference, which is typically ground as shown in FIG. 2.

In the present invention, unlike with conventional programming techniques, instead of grounding unselected wordlines, a negative voltage is supplied to the unselected wordlines. With a negative wordline voltage applied to unselected cells, a negative gate to source voltage occurs in the unselected cells.

The negative gate to source voltage applied to each unselected cell will prevent cells having a negative threshold from turning on as long as the negative gate to source voltage is less than the negative threshold voltage of the cell. Further, the negative gate to source voltage applied to the unselected cells will reduce current flow in cells which have a lower threshold than the negative gate to source voltage from previous programming methods wherein a gate to source voltage of zero volts is applied.

Figure 3:
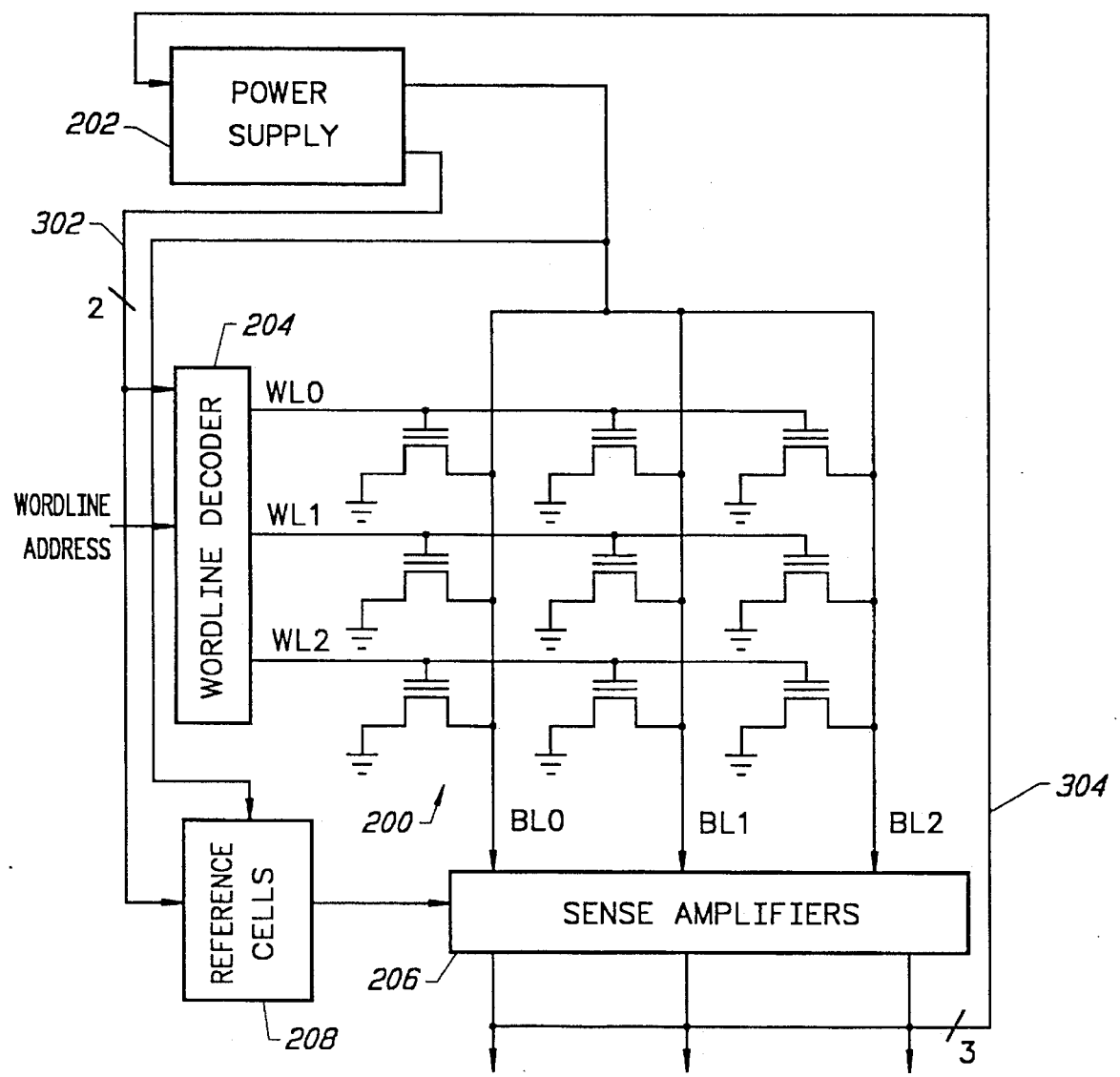
FIG. 3 shows modifications to the configuration of FIG. 2 to accommodate the method of the present invention.

FIG. 3 shows modifications to the circuitry shown in FIG. 2 to accomplish the method of the present invention. Reference numbers are maintained in FIG. 3 for components carried over from FIG. 2. As shown in FIG. 3, two lines 302 are provided from power supply 202 to carry the programming voltage for the selected wordline as well as the negative reference voltage for the unselected wordlines to the wordline decoder 204 during programming. The second line in the two lines 302 which provides the negative source to gate voltage is provided to the circuitry of wordline decoder 204 in place of ground connections in previous decoder circuitry. During read operations, a ground reference is then applied over the second line to enable the wordline decoder 204 to operate in a conventional manner.

In one embodiment of the present invention, measurements are made to assure the gate to source voltage applied to unselected cells is sufficient to substantially prevent any bit line leakage current during programming. The value of the gate to source voltage to substantially prevent bit line leakage is determined by applying an initial wordline voltage to all cells connected to the bit line to which a cell to be programmed is connected while applying a drain voltage to the bit line prior to programming to provide a bit line current. The gate to source voltage is then reduced from the initial value to a particular value where substantially no bit line current flows. A gate to source voltage having the particular value is then applied to unselected cells during programming of the selected cell to substantially prevent bit line leakage current.

FIG. 3 shows modifications to the circuit of FIG. 2 to assure substantially no bit line leakage occurs as described. FIG. 3 modifies FIG. 2 by adding a feedback 304 from the output of the sense amplifiers 206 to the power supply 202. With the feedback 304, bitline leakage current can be measured from the feedback 304 to enable the power supply to set the wordline voltage to supply to unselected cells to a level where substantially no bit line leakage current occurs.

With bit line leakage current substantially eliminated, or reduced from previous programming techniques using the present invention, power supply current will less likely be overloaded. The present invention, is thus, particularly useful when a charge pump is required as in low power devices, such as 3 V devices currently utilized with battery powered notebook computers. Further, the present invention may be utilized even if a convergence method is used to converge the thresholds of overerased cells above zero volts in case some cells still maintain a negative threshold.

Although the invention has been described above with particularity, this was merely to teach one of ordinary skill in the art how to make and use the invention. Many modifications will fall within the scope of the invention, as that scope is defined by the claims which follow.

What is claimed is:

1. A method of programming a selected memory cell in a group of memory cells having drains connected to a bit line, the method comprising the steps of:

applying a gate to source voltage of an initial value to the memory cells in the group of memory cells during application of a drain voltage to create a current in the bit line and decreasing the gate to source voltage to a first value where substantially no current flows from the bit line;

applying a first gate to source voltage to the selected cell while applying a first drain voltage with values sufficient to enable electrons to tunnel to a floating gate of the selected cell; and applying a second gate to source voltage having the first value to each non-selected cell in the group of cells during application of the first gate to source voltage and the first drain voltage.

2. The method of claim 1 wherein the initial gate to source voltage is zero volts.

3. The method of claim 2 wherein the group of cells include at least one cell with a negative threshold value.

4. The method of claim 1 wherein the group of cells comprise flash EEPROM cells.

5. A method of preventing leakage current during programming of a selected memory cell in a group of flash memory cells connected to a bit line, the method comprising the steps of:

applying a voltage of an initial value to gates of the group of flash memory cells to create a current in the bit line and then decreasing voltage applied to the gates of the group of flash memory cells to a first voltage where substantially no current flows from the bit line; and applying the first voltage to the gate of each non-selected cell in the group of flash memory cells during programming of the selected cell.

* * * * *